United States Patent
Gonzalez (10) Patent No.: US 9,143,137 B2
(45) Date of Patent: Sep. 22, 2015

(54) LOW VOLTAGE CMOS POWER ON RESET CIRCUIT

(75) Inventor: David M. Gonzalez, Mesa, AZ (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 182 days.

(21) Appl. No.: 13/371,307

(22) Filed: Feb. 10, 2012

(65) Prior Publication Data

US 2013/0207696 A1 Aug. 15, 2013

(51) Int. Cl.
*H03K 17/22* (2006.01)
*H03L 7/00* (2006.01)

(52) U.S. Cl.
CPC .......... *H03L 7/00* (2013.01); *H03K 17/223* (2013.01)

(58) Field of Classification Search
CPC .................. H03K 17/223; H03K 3/0375
USPC ........................ 327/142, 143, 198
See application file for complete search history.

(56) References Cited

U.S. PATENT DOCUMENTS

| | | | |
|---|---|---|---|
| 4,001,609 A | 1/1977 | Sickert | |
| 4,634,904 A | 1/1987 | Wong | |
| 4,970,408 A | 11/1990 | Hanke et al. | |
| 5,883,532 A | 3/1999 | Bowers | |
| 6,204,703 B1 * | 3/2001 | Kwon | 327/143 |
| 6,204,704 B1 | 3/2001 | Williams et al. | |
| 6,437,614 B1 * | 8/2002 | Chen | 327/143 |
| 7,057,427 B2 | 6/2006 | Wadhwa et al. | |
| 7,161,396 B1 | 1/2007 | Zhou et al. | |
| 7,612,588 B2 | 11/2009 | Kimura | |
| 2008/0218223 A1 * | 9/2008 | Kimura | 327/142 |

* cited by examiner

Primary Examiner — John Poos (57) ABSTRACT

An electronic circuit includes an illustrative low voltage CMOS power on reset circuit. The electronic circuit can comprise a power on reset circuit coupled between a supply voltage terminal and a signal node. The illustrative power on reset circuit comprises a voltage detector coupled to the supply voltage terminal which is configured to track CMOS thresholds and deactivate when supply voltage reaches a level for proper operation of CMOS logic.

6 Claims, 8 Drawing Sheets

LOW VOLTAGE CMOS POWER ON RESET CIRCUIT

BACKGROUND

In electronic circuits, power on reset (POR) is an electronic device incorporated into an integrated circuit (IC) which is operable to detect power applied to the IC and generate a reset pulse through the entire circuit to enable the IC to attain a known state. A simple POR circuit can be composed of an RC device that charges as the supply voltage rises. A device such as a Schmitt trigger can be used so that the rising charged voltage of the RC network generates a pulse based on the two threshold voltages of the Schmitt trigger. When the input voltage at the Schmitt trigger from the RC network reaches the first threshold voltage the output signal generated by the Schmitt trigger switches to generate a first edge of the POR signal. Charging of the RC network is intended to have sufficient duration that the POR can reset all internal circuits before charging voltage reaches the second threshold voltage of the Schmitt trigger to deactivate.

The power on reset pulse is used to initialize sequential logic circuits upon power-up. If the sequential logic powers up in the wrong state, catastrophic system malfunction can result.

BRIEF DESCRIPTION OF THE DRAWINGS

Embodiments of the invention relating to both structure and method of operation may best be understood by referring to the following description and accompanying drawings.

DETAILED DESCRIPTION

When power is applied to a digital logic circuit, the logic is to be initialized to a known state. One initialization technique is usage of an automatic power on reset (POR) signal which is active during the power supply voltage ramp-up which then deactivates once the power supply voltage is valid. If the POR signal deactivates too soon, the logic may not be correctly initialized. In many systems the power supply voltage is just high enough for the CMOS logic circuits to function properly, so if the threshold for POR deactivation is too high, the logic could be held forever in the reset state. So, for example with low supply voltage applications, a narrow range exists for supply voltage detection for POR signal deactivation.

Embodiments of an electronic circuit include an illustrative low voltage CMOS power on reset circuit. The electronic circuit can comprise a power on reset circuit coupled between a supply voltage terminal and a signal node. The illustrative power on reset circuit comprises a voltage detector coupled to the supply voltage terminal which is configured to track CMOS thresholds and deactivate when supply voltage reaches a level for proper operation of CMOS logic.

Figure 8:
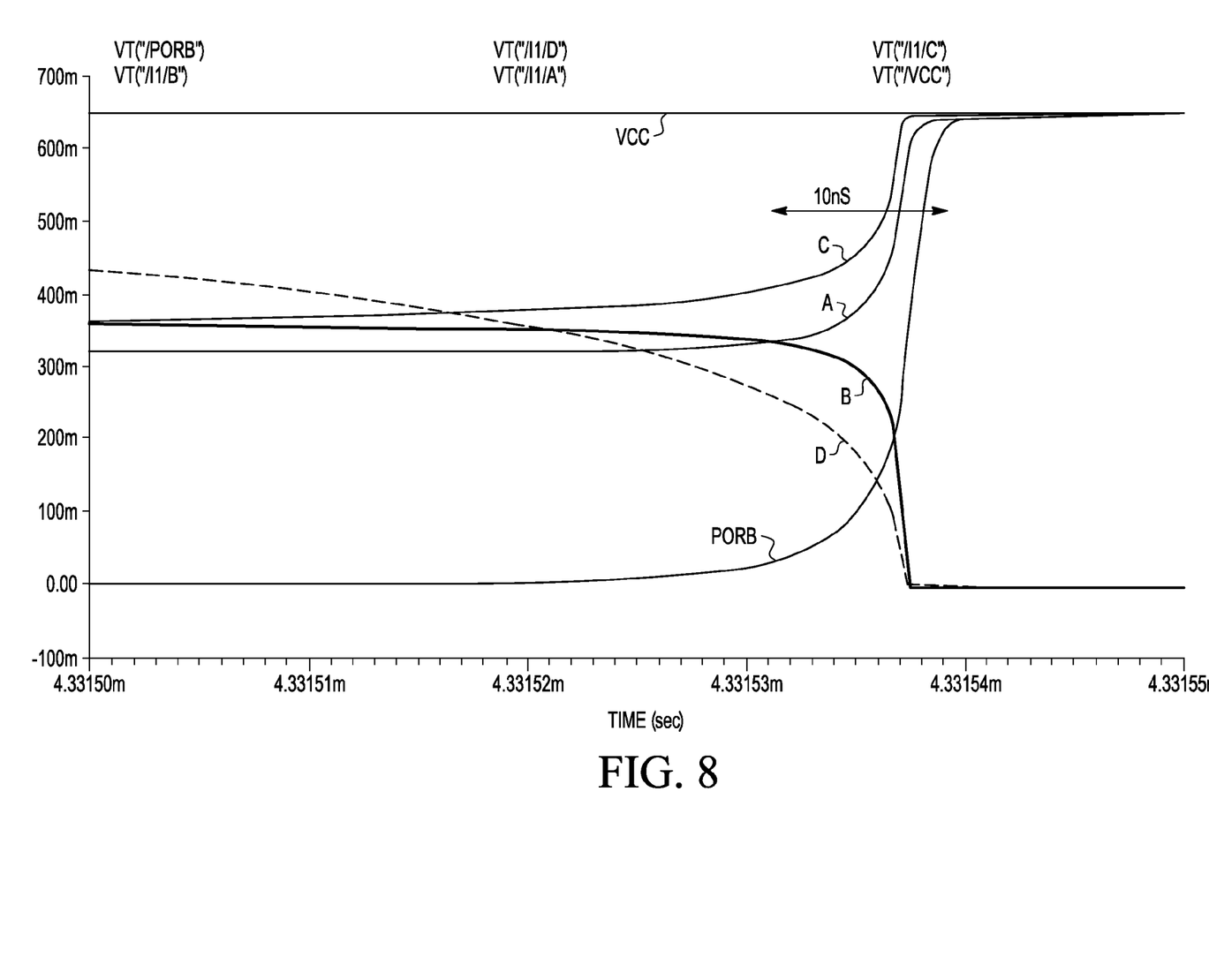
FIG. 8 is a transient response time graph respectively showing signals at terminals and nodes during operation of the power on reset circuit.
Figure 9:
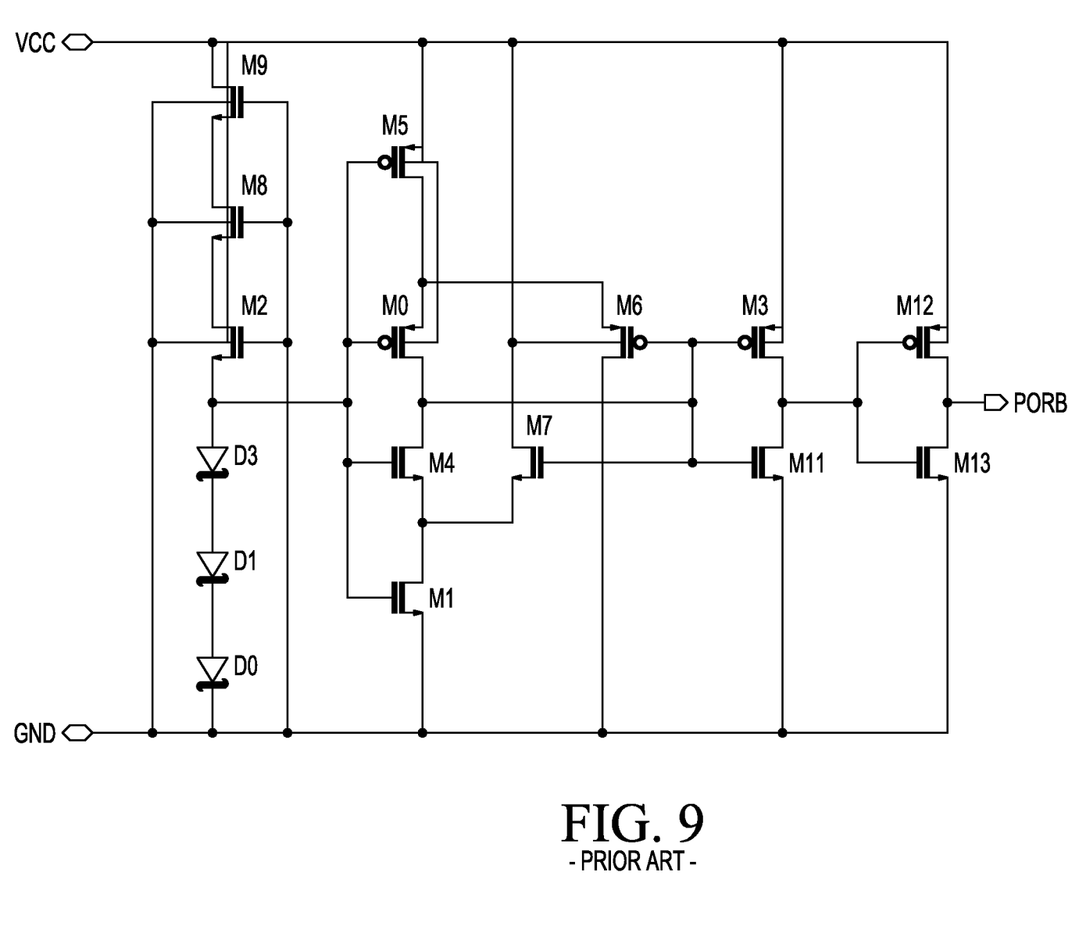
FIG. 9 is a schematic circuit diagram showing a power management circuit for usage in power management integrated circuits (ICs) which is subject to malfunction and can be improved by the circuits disclosed in FIGS. 1 through 8.

FIG. 9 is a schematic circuit diagram showing a power management circuit for usage in power management integrated circuits (ICs) which is subject to malfunction. Series Schottky diodes are used to determine when the power supply reaches a final voltage. Over process and temperature variation, the approach does not always operate properly since Schottky diode characteristics are not correlated to metal oxide semiconductor (MOS) thresholds. Power on reset circuits are susceptible to difficulties including a risk of starting in an incorrect state or other malfunction, difficulty in tracking CMOS thresholds, lack of hysteresis, drawing a relatively large amount of current, and/or the like. Typical power on reset circuits have various issues including failure to attain ensured correct operation, failure to track CMOS thresholds, lack of hysteresis, more complexity than may be desired, and the like. In contrast, the circuits disclosed herein with respect to FIGS. 1 through 8 use the same device types in the power on reset circuitry as in controlled logic and can be integrated on the same integrated circuit as the slave logic circuits, and thus tracks process and temperature variation.

The circuits and methods disclosed herein thus enable the POR signal to activate and deactivate at the proper power supply voltage. The systems and methods disclosed herein avoid incorrect operation and malfunction, and other difficulties at least partly by deactivating the power on reset signal when the rising edge of the supply signal exceeds the sum of NMOS and PMOS thresholds, for example when $VCC > vt_{NMOS} + vt_{PMOS}$. The illustrative disclosed circuits and methods are useful in many or most CMOS fabrication technologies. Embodiments of the disclosed circuits have low complexity, draw very low current, and have no ambiguous states which could result in malfunction, such as absent, infinite, or jittering power on reset (POR) pulses. Correct performance in a low complexity and efficient circuit is beneficial in creating improved probability of first pass success in a circuit implementation, reduced time to market, reduced customer returns, lower current drain, and reduced silicon area.

The disclosed circuits and/or methods can include a feedback path which produces large hysteresis which causes crisp crossover.

Disclosed embodiments of power on reset circuits and methods detect when the supply has risen to the voltage upon which common CMOS logic circuits properly function. That voltage, for example is the threshold voltage for NMOS and PMOS transistors, specifically $vt_{NMOS} + vt_{PMOS}$.

Figure 1:
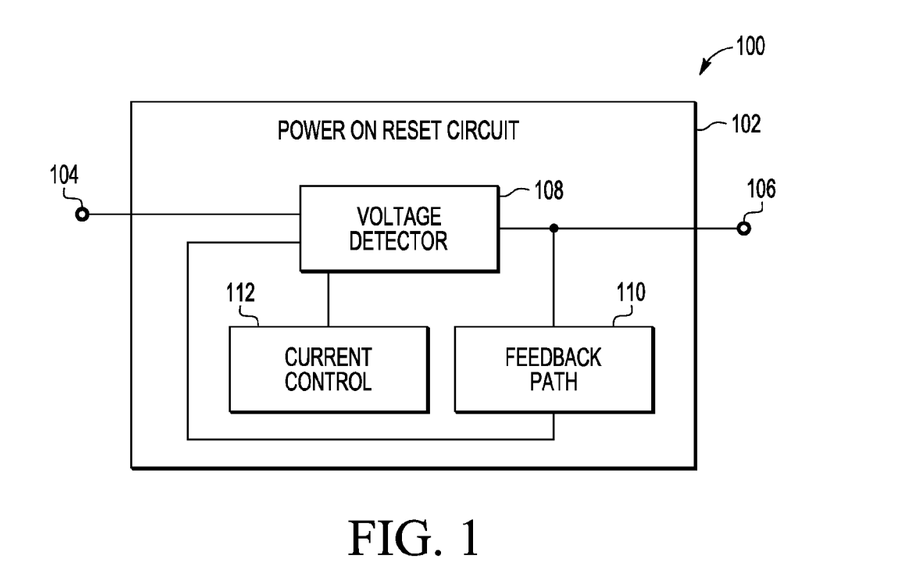
FIG. 1 is a schematic block diagram depicting an embodiment of an electronic circuit that includes an illustrative low voltage CMOS power on reset circuit.

Referring to FIG. 1, a schematic block diagram depicts an embodiment of an electronic circuit 100 that includes an illustrative low voltage complementary metal oxide semiconductor (CMOS) power on reset circuit 102. The electronic circuit 100 can comprise a power on reset circuit 102 coupled between a supply voltage terminal 104 and a signal node 106. The illustrative power on reset circuit 102 comprises a voltage detector 108 coupled to the supply voltage terminal 104 which is configured to track CMOS thresholds and deactivate when supply voltage reaches a level for proper operation of CMOS logic.

In some embodiments, the electronic circuit 100 can be configured wherein the power on reset circuit 102 further comprises a feedback path 110 coupled to the voltage detector 108 which is configured to stabilize the signal node 106 on deactivation and immunize the signal node 106 from supply noise or fluctuation.

In various embodiments, the electronic circuit 100 can be configured wherein the power on reset circuit 102 further comprises a current control device 112 coupled to the voltage detector 108 configured to apply a pulldown resistance to the voltage detector 108.

In an illustrative embodiment, the electronic circuit 100 can be formed such that the power on reset circuit 102 comprises NMOS and PMOS transistors and is configured to detect when the supply voltage is greater than a threshold comprising an N-type MOS threshold plus a P-type MOS threshold. When the threshold is reached, the power on reset circuit 102 deactivates a power on reset signal at the signal node 106.

In some embodiments, the power on reset circuit 102 has minimal complexity and thus uses very little silicon area, and draws very little current, which is of concern in many applications. The threshold is no higher than what is needed to ensure correct operation so that the circuit can be used in systems in which the supply is just barely above the minimum for CMOS logic to operate. The power on reset circuit 102 detects when the supply voltage VCC is above NMOS threshold plus PMOS threshold. Once that threshold is reached, the power on reset signal deactivates and positive feedback locks the deactivated state so that the power on reset signal is immune to supply noise or fluctuation.

The high accuracy of the threshold of the illustrative power on reset circuit 102 is useful since, in many applications, CMOS logic operates at a voltage that is just barely high enough for operation. If the threshold of the power on reset circuit is not sufficiently accurate then the power on reset signal may never disable or deactivate when the supply reaches the final value. The window of voltage between $vt_{P\text{-}MOS}+vt_{NMOS}$ and the final supply voltage could be very small, which could otherwise hold the logic reset forever. Without hysteresis, a noisy supply voltage or supply voltage that regresses a small amount, for example in the range of millivolts, would cause the system to go back into a reset state. The illustrative power on reset circuit 102 avoids this possibility of failure.

Figure 2:
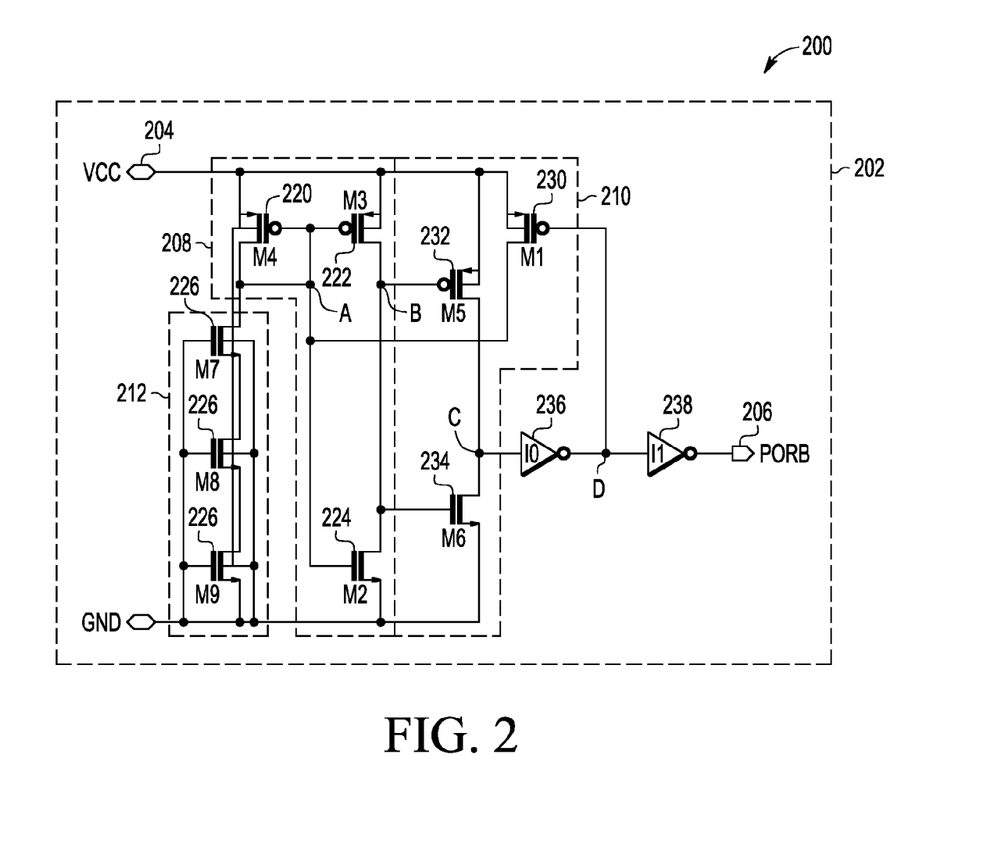
FIG. 2 is a schematic circuit diagram showing an embodiment of an electronic circuit formed wherein a power on reset circuit comprises a plurality of CMOS transistors.

Referring to FIG. 2, an embodiment of an electronic circuit 200 can be formed wherein a power on reset circuit 202 comprises a plurality of CMOS transistors. The illustrative power on reset circuit 202 includes a voltage detector 208, a current control device 212, a feedback path 210, and an output driver 238. The voltage detector 208 is operable to detect supply voltage at a supply voltage terminal 204 and includes transistors M2 (NMOS transistor 224), M3 (PMOS transistor 222), and M4 (PMOS transistor 220). In an illustrative embodiment, the current control device 212 can include transistors M7, M8, and M9. The illustrative feedback path 210 can be formed by transistors M5 (PMOS transistor 232) and M6 (NMOS transistor 234), inverter I0 236, and transistor M1 (PMOS transistor 230).

Accordingly, the voltage detector 208 can comprise first M4 220 and second M3 222 PMOS transistors, and a first NMOS transistor M2 224. The first PMOS transistor M4 220 can comprise a first electrode coupled to the supply voltage, a second electrode, and a gate. The second PMOS transistor M3 222 can comprise a first electrode coupled to the supply voltage, a second electrode, and a gate coupled to the gate of the first PMOS transistor M4 220. The first NMOS transistor M2 224 can comprise a first electrode coupled to the second electrode of the second PMOS transistor M3 222, a second electrode coupled to ground, and a gate coupled to the gates of the first M4 220 and second M3 222 PMOS transistors.

In some embodiments, the electronic circuit 200 can be formed wherein the power on reset circuit 202 further comprises a current control device 212 coupled to the second electrode of the first PMOS transistor M4 220 and the gates of the first M4 220 and second M3 222 PMOS transistors and the gate of the first NMOS transistor M2 224. The current control device 212 can comprise at least one transistor (M7, M8, M9) 226 operable as a pulldown resistance. In the depicted embodiment, the current control device 212 is formed of transistors M7, M8, and M9 which can be depletion mode n-channel field effect transistors (FETs) and operate as a resistive pulldown for node A.

In another example embodiment, the electronic circuit 200 can be formed wherein the power on reset circuit 202 further comprises a feedback path 210 including a plurality of transistors. Accordingly, an embodiment of feedback path 210 can comprise third M1 230 and fourth M5 232 PMOS transistors, a second NMOS transistor M6 234, and an inverter 236. The third PMOS transistor M1 230 can comprise a first electrode coupled to the supply voltage, a second electrode coupled to the gates of the first M4 220 and second M3 222 PMOS transistors and the first NMOS transistor M2 224, and a gate. The fourth PMOS transistor M5 232 can comprise a first electrode coupled to the supply voltage, a second electrode, and a gate coupled to the second electrode of the second PMOS transistor M3 222. The second NMOS transistor M6 234 can comprise a first electrode coupled to the second electrode of the fourth PMOS transistor M5 232, a second electrode coupled to ground, and a gate coupled to the second electrode of the second PMOS transistor M3 222. The inverter 236 can be coupled between the second electrode of the fourth PMOS transistor M5 232 and the gate of the third PMOS transistor M1 230.

In an example embodiment, fourth PMOS transistor M5 232 and second NMOS transistor M6 234 can have fairly standard devices sizes. Inverters I0 236 and I1 238 can be standard cell inverters. Third PMOS transistor M1 230 can be a relatively small transistor which is used to overdrive the resistors, but sufficiently large to pull node A up to the supply voltage. Third PMOS transistor M1 230 acts as a hysteresis driver.

In an illustrative embodiment, the electronic circuit 200 can be configured wherein the power on reset circuit 202 further comprises an output driver 238 coupled between the inverter 236 and the signal node 206.

In a further embodiment, the electronic circuit 200 can be configured wherein the first PMOS transistor M4 220 and the second PMOS transistor M3 222 are operable as a current mirror to control and monitor current flowing to the first NMOS transistor M2 224. The first NMOS transistor M2 224 is sufficiently larger, for example in transistor length, width and/or oxide thickness, than the second PMOS transistor M3 222 to ensure overdriving of the second PMOS transistor M3 222 when the supply voltage reaches a level for proper operation of CMOS logic. Sizing of the first NMOS transistor M2

224 sufficiently larger than the second PMOS transistor M3 222 ensures overdriving of the second PMOS transistor M3 222 without increasing the threshold but rather maintaining the threshold at $vt_{PMOS}+vt_{NMOS}$.

Figure 3:
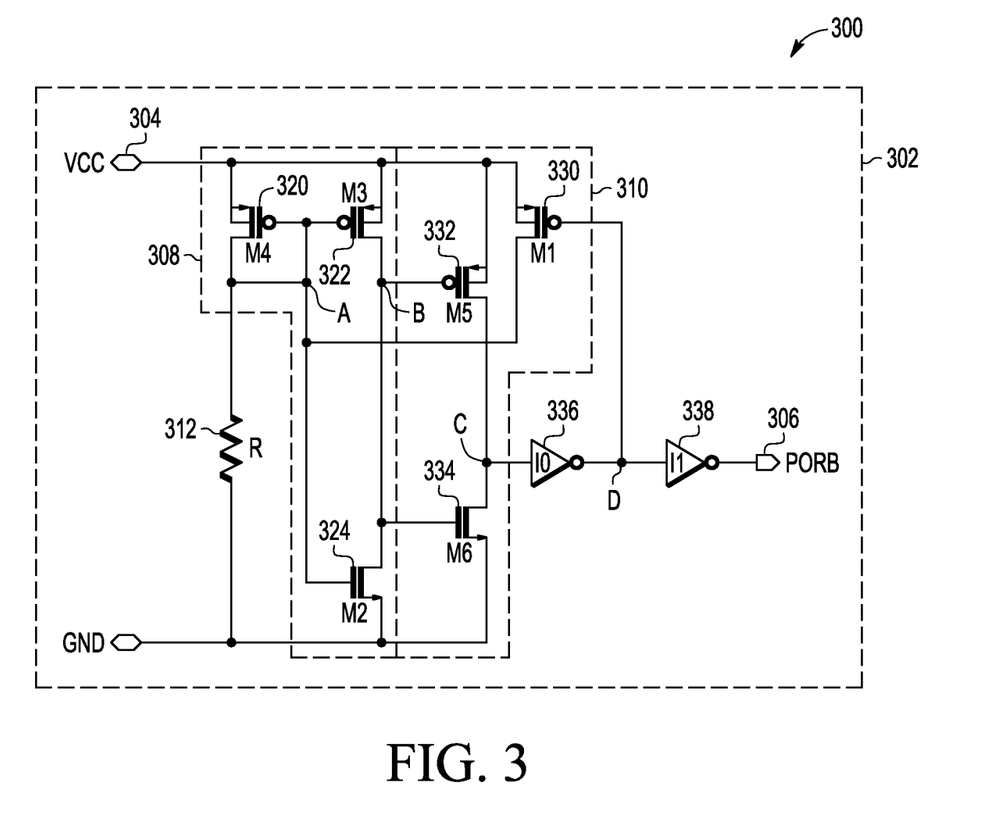
FIG. 3 is a schematic circuit diagram illustrating an embodiment of an electronic circuit that is formed wherein a power on reset circuit comprises a plurality of CMOS transistors and current control device formed of one or more resistors.

Referring to FIG. 3, an embodiment of an electronic circuit 300 can be formed wherein a power on reset circuit 302 comprises a plurality of CMOS transistors and current control device 312 formed of one or more resistors. Accordingly, the electronic circuit 300 can be formed wherein the power on reset circuit 302 further comprises a current control device 312 coupled to the second electrode of the first PMOS transistor M4 320 and the gates of the first M4 320 and second M3 322 PMOS transistors and the gate of the first NMOS transistor M2 324. The illustrative current control device 312 comprises at least one resistor.

In the depicted embodiment, the current control device 312 is formed of one or more resistors that function as a resistive pulldown for node A, while maintaining the improvements attained by threshold control at $vt_{PMOS}+vt_{NMOS}$.

The current control device 312 shown in FIG. 3 performs the same function as the current control device 212 of FIG. 2 but is more wasteful in terms of current drain. The arrangement of transistors M7, M8, M9 saturates when the voltage on the drain of M7, at node A, reaches a minus one times vt of the depletion mode devices relative to ground, in an example technology approximately 300 millivolts. When the signal at node A reaches that voltage then the current no longer increases with voltage as a resistor would, thus reducing current drain and improving efficiency. When third PMOS transistor M1 230 turns on, the supply voltage VCC is applied across the current control device 212 formed by transistors M7, M8, and M9, resulting in a small, nonzero current drain. The current drain can be selected based on selection and specification of devices in the current control device 212. In an illustrative implemented embodiment, current drain is 193 nA maximum (worst case), and typically 44 nA, a relatively insignificant amount of current which is very low compared to current typically drawn on the integrated circuit. The current control device 212 shown in FIG. 2 performs the function of holding current out of first PMOS transistor M4 220 all the way down to zero volts, and thus acts as a resistor at low voltage but saturates as the voltage rises.

Figure 4:
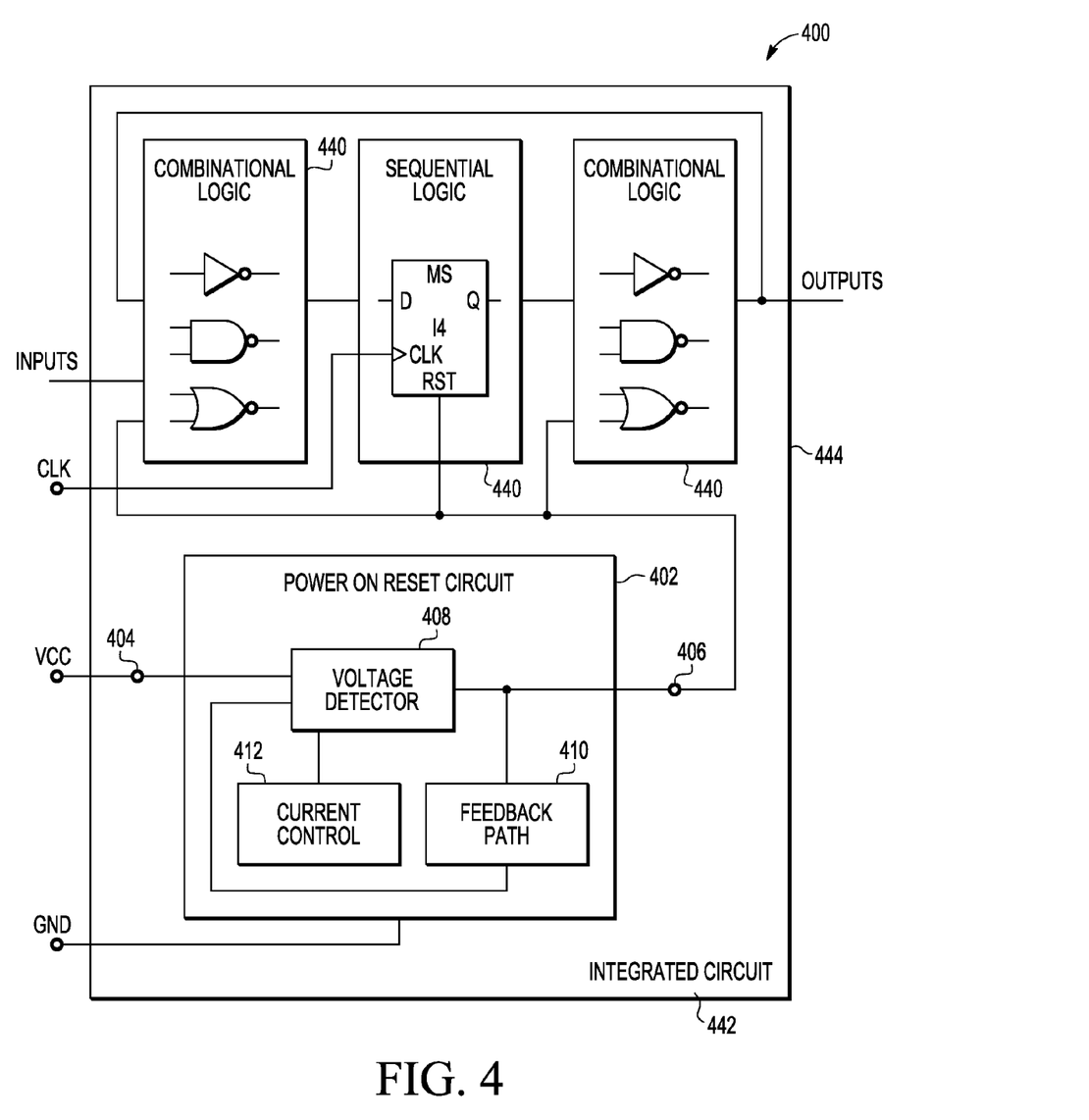
FIG. 4 is a schematic block diagram which depicts an embodiment of an electronic circuit configured as a CMOS integrated circuit chip with CMOS logic circuits and a power on reset circuit that ensures correct sequential logic circuit initialization upon power-up.

Referring to FIG. 4, a schematic block diagram depicts an embodiment of an electronic circuit 400 configured as a CMOS integrated circuit chip with CMOS circuits 440 and a power on reset circuit 402 that ensures correct sequential logic circuit initialization upon power-up. FIG. 4 depicts the disclosed CMOS power on reset circuit topology. The power on reset circuit 402 can be integrated on the same chip as the combinational logic 440 and sequential logic 440 and uses the same device types as the digital logic that is controlled so that the power on reset pulse is generated reliably over and can track process and temperature variation. The power on reset circuit 402 holds the CMOS circuits 440 in reset until the power supply reaches the level in which those circuits function properly. Thus, the power on reset circuit 402 automatically deactivates when the supply voltage reaches the level in which the CMOS circuits properly operate. The role of the power on reset circuit 402 in the system block diagram is otherwise unchanged in comparison to known circuits.

In an illustrative embodiment, the electronic circuit 400 comprises a CMOS circuit 442 integrated on a single integrated circuit chip 444 including a plurality of CMOS circuits 440 and a power on reset circuit 402. The power on reset circuit 402 is coupled to the plurality of CMOS circuits 440 between a supply voltage terminal 404 and a signal node 406 and is configured to track CMOS thresholds and deactivate when supply voltage reaches a level for proper operation of CMOS logic. In some embodiments, the electronic circuit 400 can be configured such that the power on reset circuit 402 further comprises a voltage detector 408, a feedback path 410, and a current control device 412. The voltage detector 408 is coupled to the supply voltage terminal 404 and is configured to track CMOS thresholds and deactivate when supply voltage reaches a level for proper operation of CMOS logic. The feedback path 410 is coupled to the voltage detector 408 and is configured to stabilize the signal node 406 on deactivation and immunize the signal node from supply noise or fluctuation. The current control device 412 is coupled to the voltage detector 408 and configured to apply a pulldown resistance to the voltage detector 408.

In an example embodiment, the electronic circuit 400 can be formed such that the power on reset circuit 402 is formed of NMOS and PMOS transistors configured to detect when the supply voltage is greater than a threshold comprising an N-type MOS threshold plus a P-type MOS threshold. When the threshold is reached, the power on reset circuit 402 deactivates a power on reset signal at the signal node 406.

Figure 5:
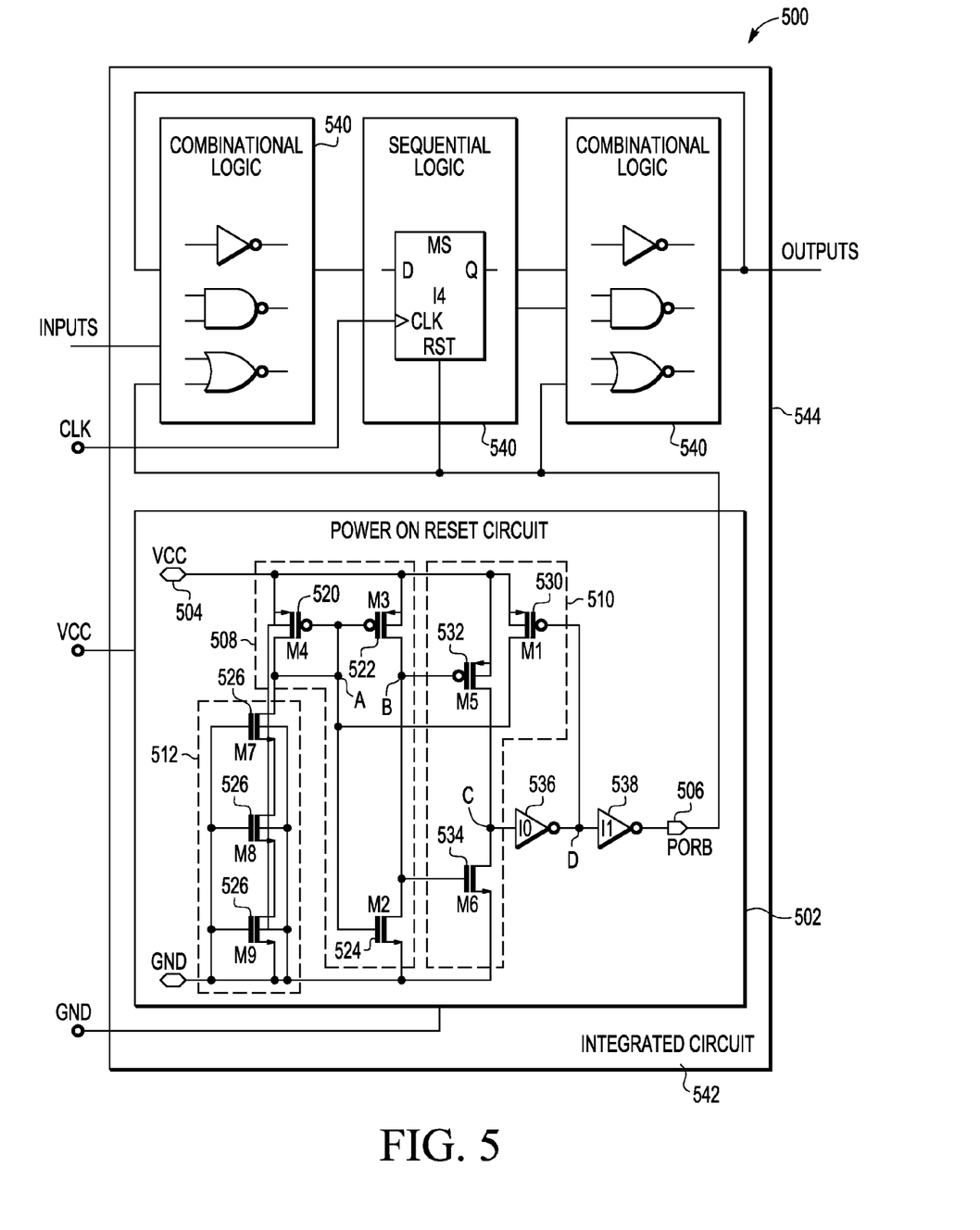
FIG. 5 is schematic circuit diagram showing an embodiment of an electronic circuit configured as a CMOS integrated circuit chip with CMOS logic circuits and a power on reset circuit can be formed wherein the power on reset circuit comprises a plurality of CMOS transistors.

Referring to FIG. 5, an embodiment of an electronic circuit 500 configured as a CMOS integrated circuit 542 on a single integrated circuit chip 544 with CMOS circuits 540 and a power on reset circuit 502 can be formed wherein the power on reset circuit 502 comprises a plurality of CMOS transistors. In an illustrative embodiment, the electronic circuit 500 can be configured such that the power on reset circuit 502 further comprises a voltage detector 508, and a current control device 512. The voltage detector 508 can comprise a first PMOS transistor M4 520, a second PMOS transistor M3 522, and a first NMOS transistor M2 524. The first PMOS transistor M4 520 comprises a first electrode coupled to the supply voltage, a second electrode, and a gate. The second PMOS transistor M3 522 comprises a first electrode coupled to the supply voltage, a second electrode, and a gate coupled to the gate of the first PMOS transistor M4 520. The first NMOS transistor M2 524 comprises a first electrode coupled to the second electrode of the second PMOS transistor M3 522, a second electrode coupled to ground, and a gate coupled to the gates of the first M4 520 and second M3 522 PMOS transistors. The current control device 512 is coupled to the second electrode of the first PMOS transistor M4 520 and the gates of the first M4 520 and second M3 522 PMOS transistors and the gate of the first NMOS transistor M2 524. The current control device 512 comprises at least one transistor 526 which is operable as a pulldown resistance.

In some embodiments, the electronic circuit 500 can be configured wherein the power on reset circuit 502 further comprises a feedback path 510. The feedback path 510 can comprise third M1 530 and fourth M5 532 PMOS transistors, a second NMOS transistor M6 534, and an inverter 536. The third PMOS transistor M1 530 can comprise a first electrode coupled to the supply voltage, a second electrode coupled to the gates of the first M4 520 and second M3 522 PMOS transistors and the first NMOS transistor M2 524, and a gate. The fourth PMOS transistor M5 532 can comprise a first electrode coupled to the supply voltage, a second electrode, and a gate coupled to the second electrode of the second PMOS transistor M3 522. The second NMOS transistor M6 534 can comprise a first electrode coupled to the second electrode of the fourth PMOS transistor M5 532, a second electrode coupled to ground, and a gate coupled to the second electrode of the second PMOS transistor M3 522. The inverter 536 is coupled between the second electrode of the fourth PMOS transistor M5 532 and the gate of the third PMOS transistor M1 530.

In some embodiments and/or applications, the electronic circuit 500 can be configured wherein the power on reset circuit 502 further comprises an output driver 538 coupled between the inverter 536 and the signal node 506.

In the arrangement shown in FIG. 5, the first PMOS transistor M4 520 and the second PMOS transistor M3 522 are operable as a current mirror to control and monitor current flowing to the first NMOS transistor M2 524. The first NMOS transistor M5 524 can be sufficiently larger than the second PMOS transistor M3 522 to ensure overdriving of the second PMOS transistor M3 522 when the supply voltage reaches a level for proper operation of CMOS logic.

The electronic circuits depicted in FIGS. 1 through 5 can be used in any suitable circuit, for example power management integrated circuits or any integrated circuit which contains CMOS digital logic.

The illustrative power on reset circuits use NMOS and PMOS transistors rather than some other type of circuit element to set threshold and enable measurement of the supply voltage.

The illustrative power on reset circuits track both NMOS and PMOS thresholds in combination, enabling more reliable setting of thresholds, and thus more reliable operation, than circuits that use only a single MOS threshold or circuits that use other components such as diodes to set thresholds. Diodes do not track CMOS thresholds. Pn-junction diodes introduce a substantial threshold variation and Schottky diodes, while better, can have a normal range of threshold variation that is fairly wide. The large variation in threshold introduced by diodes greatly increases the probability of power on reset failure.

The illustrative power on reset circuits trigger at $vt_{NMOS}+vt_{PMOS}$, the sum of the two thresholds, resulting in a finite amount of bias current, a small but greater than subthreshold current.

Figure 6:
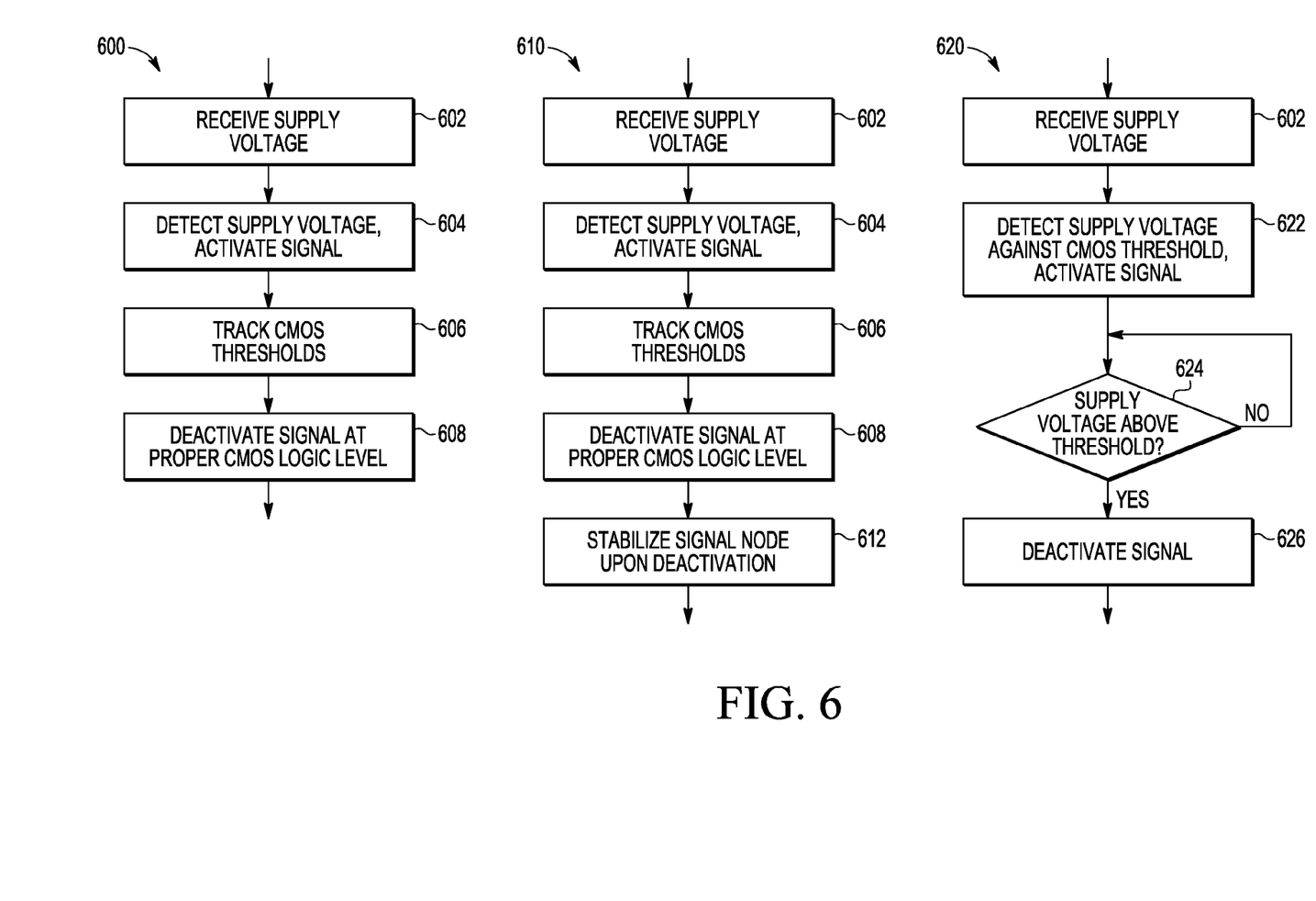
FIG. 6 shows schematic flow charts illustrating an embodiment or embodiments of a method for generating a power on reset signal which can be operable in an electronic circuit with a power on reset circuit.

Referring to FIG. 6, schematic flow charts illustrate an embodiment or embodiments of a method for generating a power on reset signal which can be operable in an electronic circuit a power on reset circuit coupled between a supply voltage terminal and a signal node. As shown in FIG. 6, a method 600 for generating a power on reset signal can comprise receiving 602 a supply voltage at the supply voltage terminal to activate the power on reset signal, detecting 604 the supply voltage, and tracking 606 CMOS thresholds. The method 600 can further comprise deactivating 608 when supply voltage reaches a level for proper operation of CMOS logic.

In some embodiments, a method 610 can further comprise stabilizing 612 the signal node upon deactivation and immunizing the signal node from supply noise or fluctuation using feedback.

In various embodiments, the method 620 for generating a power on reset signal can further comprise detecting 622 when the supply voltage is greater than a threshold comprising an N-type MOS threshold plus a P-type MOS threshold, and, when the threshold is reached 624, deactivating 626 a power on reset signal at the signal node.

Figure 7:
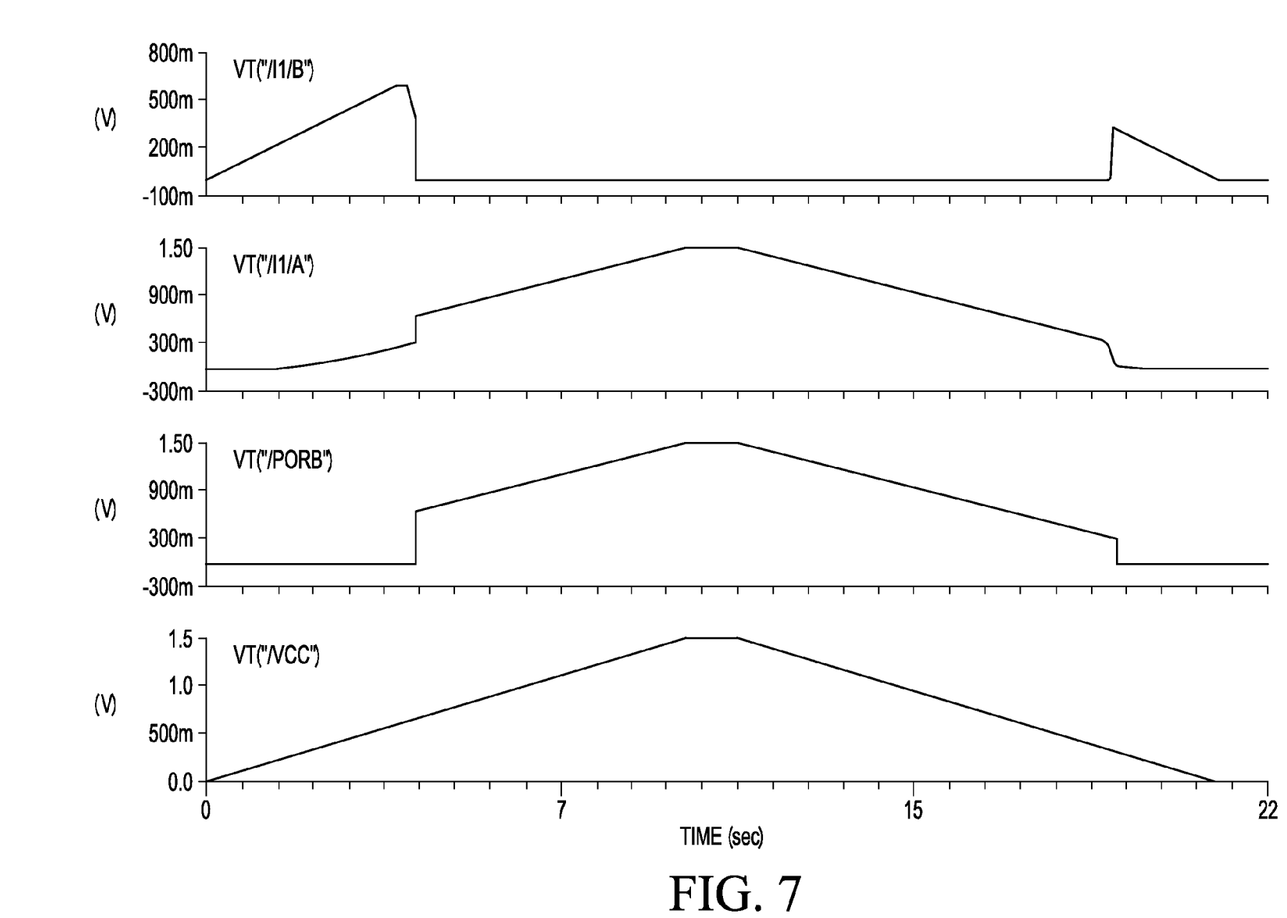
FIG. 7 is a timing chart showing signals at terminals and nodes during operation of the power on reset circuit.

Referring to FIGS. 7 and 8, a timing chart and transient response time graph respectively show signals at terminals and nodes depicted, for example in the circuit diagrams of FIGS. 2, 3, and 5. As the supply voltage VCC rises from zero (0) volts, the signal at node A is held at 0 volts by the pulldown resistance of the current control device (for example transistors M7-M9 in FIGS. 2 and 5). When the supply voltage VCC reaches the PMOS threshold $vt_{PMOS}$, the signal at node B is pulled up to VCC by transistor M3 (second PMOS transistors 222, 322, 522). As supply voltage VCC continues to rise, the signal at node A follows, being approximately equal to the voltage $VCC-vt_{PMOS}$. When the supply voltage VCC reaches the maximum of either the PMOS threshold $vt_{PMOS}$ or the NMOS threshold $vt_{NMOS}$, transistor M6 (second NMOS transistors 234, 334, 534) turns on, and the signal at node D rises to VCC and the signal node PORB activates with a 0 volt signal. When the supply voltage VCC reaches the sum of PMOS threshold and the NMOS threshold ($vt_{PMOS}+vt_{NMOS}$), transistor M2 (first NMOS transistors 224, 324, 524) begins to conduct. As the supply voltage VCC continues to rise, transistor M2 (first NMOS transistors 224, 324, 524) overdrives transistor M3 (second PMOS transistors 222, 322, 522), pulling the signal at node B low, driving the signal at node C high, pulling the signal at node D low, and driving the signal at the signal node PORB high to a deactivated state. At the same time, transistor M1 (third PMOS transistors 230, 330, 530) turns on, pulling node A from the voltage VCC less the PMOS threshold $vt_{PMOS}$ ($VCC-vt_{PMOS}$) up to the supply voltage VCC. The operation of the transistor M1 (third PMOS transistors 230, 330, 530) supplies positive feedback that causes supply noise immunity and locks the circuit in the deactivated state as long as VCC is greater than the maximum of either the PMOS threshold $vt_{PMOS}$ or the NMOS threshold $vt_{NMOS}$, ($VCC>\max[vt_{PMOS}, vt_{NMOS}]$).

Accordingly, the power on reset signal PORB corresponds to the result of VCC voltage detection and hysteresis (feedback). The low threshold is the maximum of either the PMOS threshold $vt_{PMOS}$ or the NMOS threshold $vt_{NMOS}$, (max $[vt_{PMOS}, vt_{NMOS}]$). The high threshold is the sum of the PMOS threshold $vt_{PMOS}$ plus the NMOS threshold $vt_{NMOS}$, ($vt_{PMOS}+vt_{NMOS}$).

Referring to FIG. 7, hysteresis is shown in which the waveform at node A follows the supply voltage VCC with the PMOS threshold voltage $vt_{PMOS}$ below until the node A signal reaches the circuit threshold. Then the node A signal quickly rises to VCC. The magnitude of the hysteresis is $vt_{PMOS}$ because the voltage drop across transistor M4 (first PMOS transistors 220, 320, 520) falls from $vt_{PMOS}$ to zero when transistor M1 (third PMOS transistors 230, 330, 530) turns on.

In an example implemented embodiment of a power on reset circuit, hysteresis is specified over worst case simulations in a range from 169 to 552 millivolts. Other embodiments may specify other hysteresis ranges.

The disclosed power on reset circuits automatically deactivate when the supply voltage reaches the level in which the CMOS circuit logic circuits operate properly. Thus, when the NMOS plus PMOS threshold ($vt_{PMOS}+vt_{NMOS}$) is reached, the CMOS logic is fully functional with no floating internal nodes. In the situation wherein the supply voltage VCC is less than $vt_{PMOS}+vt_{NMOS}$, a range of voltages on the input of a CMOS logic gate exists in which all of the output transistors are off, therefore causing the output of the logic gate to become a floating node. When the supply voltage VCC is above $vt_{PMOS}+vt_{NMOS}$, one of the output transistors is always on for any input voltage.

The current control device 212 shown in FIG. 2 is formed of transistors M7, M8, and M9 which can be depletion mode n-channel FETs and operate as a resistive pulldown for node A. Otherwise one or more resistors can be used, as shown in FIG. 3. Usage of depletion mode FETs has the advantage of saturating when node A reaches a depletion voltage $-vt_{DEPL}$, thereby minimizing current drain after the supply is up to VCC.

An example embodiment implemented in a Power Management Integrated Circuit (PMIC) has attained a range of power on reset signal PORB high threshold of 312 to 1039 mV over process and temperature variation, tracking MOS characteristics, as intended. A typical threshold can be, for example, 725 mV. In the implemented embodiment, a specification for minimum supply voltage VCC can be 1.1 volts, current drain (min, typ, max) can be (5.5, 44, 193) nA, and a hysteresis of 169-552 mV. The implementations can be configured with different specifications, as desired.

While the principles of the disclosed system are described above in connection with specific apparatus, it is to be clearly understood that this description is made only by way of example and not as a limitation on scope of the appended claims.

The illustrative pictorial diagrams depict structures and process actions in a manufacturing process. Although the particular examples illustrate specific structures and process acts, many alternative implementations are possible and commonly made by simple design choice. Manufacturing actions may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, shapes, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. An electronic circuit comprising:
   a power on reset circuit coupled between a supply voltage terminal and a signal node comprising:
     a voltage detector coupled to the supply voltage terminal configured to track complementary metal oxide semiconductor (CMOS) thresholds and deactivate when supply voltage reaches a level for proper operation of CMOS logic, wherein the power on reset circuit further comprises:
       a voltage detector comprising:
         a first PMOS transistor comprising a first electrode coupled to the supply voltage, a second electrode, and a gate;
         a second PMOS transistor comprising a first electrode coupled to the supply voltage, a second electrode, and a gate coupled to the gate of the first PMOS transistor; and
         a first NMOS transistor comprising a first electrode coupled to the second electrode of the second PMOS transistor, a second electrode coupled to ground, and a gate coupled to the gates of the first and second PMOS transistors; and
     a feedback path comprising:
       a third PMOS transistor comprising a first electrode coupled to the supply voltage, a second electrode coupled to the gates of the first and second PMOS transistors and the first NMOS transistor, and a gate;
       a fourth PMOS transistor comprising a first electrode coupled to the supply voltage, a second electrode, and a gate coupled to the second electrode of the second PMOS transistor;
       a second NMOS transistor comprising a first electrode coupled to the second electrode of the fourth PMOS transistor, a second electrode coupled to ground, and a gate coupled to the second electrode of the second PMOS transistor; and
       an inverter coupled between the second electrode of the fourth PMOS transistor and the gate of the third PMOS transistor.

2. The electronic circuit according to claim 1 wherein the power on reset circuit further comprises:
   an output driver coupled between the inverter and the signal node.

3. The electronic circuit according to claim 1 wherein:
   the first PMOS transistor and the second PMOS transistor are operable as a current mirror to control and monitor current flowing to the first NMOS transistor; and
   the first NMOS transistor is sufficiently larger than the second PMOS transistor to overdrive the second PMOS transistor when the supply voltage reaches a level for proper operation of CMOS logic.

4. An electronic circuit comprising:
   a complementary metal oxide semiconductor (CMOS) circuit integrated on a single integrated circuit chip comprising:
     a plurality of CMOS circuits; and
     a power on reset circuit coupled to the plurality of CMOS circuits between a supply voltage terminal and a signal node configured to track CMOS thresholds and deactivate when supply voltage reaches a level for proper operation of CMOS logic, wherein the power on reset circuit comprises NMOS and PMOS transistors and is configured to detect when the supply voltage is greater than a threshold comprising an N-type MOS threshold plus a P-type MOS threshold and, when the threshold is reached, deactivate a power on reset signal at the signal node; and
   a feedback path comprising:
     a third PMOS transistor comprising a first electrode coupled to the supply voltage, a second electrode coupled to the gates of the first and second PMOS transistors and the first NMOS transistor, and a gate;
     a fourth PMOS transistor comprising a first electrode coupled to the supply voltage, a second electrode, and a gate coupled to the second electrode of the second PMOS transistor;
     a second NMOS transistor comprising a first electrode coupled to the second electrode of the fourth PMOS transistor, a second electrode coupled to ground, and a gate coupled to the second electrode of the second PMOS transistor; and
     an inverter coupled between the second electrode of the fourth PMOS transistor and the gate of the third PMOS transistor.

5. The electronic circuit according to claim 4 wherein the power on reset circuit further comprises:
   a voltage detector comprising:
     a first PMOS transistor comprising a first electrode coupled to the supply voltage, a second electrode, and a gate;
     a second PMOS transistor comprising a first electrode coupled to the supply voltage, a second electrode, and a gate coupled to the gate of the first PMOS transistor; and
     a first NMOS transistor comprising a first electrode coupled to the second electrode of the second PMOS transistor, a second electrode coupled to ground, and a gate coupled to the gates of the first and second PMOS transistors.

6. The electronic circuit according to claim 5 wherein:

the first PMOS transistor and the second PMOS transistor are operable as a current mirror to control and monitor current flowing to the first NMOS transistor; and the first NMOS transistor is sufficiently larger than the second PMOS transistor to overdrive the second PMOS transistor when the supply voltage reaches a level for proper operation of CMOS logic.

\* \* \* \* \*